United States Patent
Guo et al.

(10) Patent No.: US 12,262,561 B2
(45) Date of Patent: Mar. 25, 2025

(54) PHOTOVOLTAIC MODULE AND METHOD FOR PREPARING THE PHOTOVOLTAIC MODULE

(71) Applicants: JINKO SOLAR (HAINING) CO., LTD., Zhejiang (CN); ZHEJIANG JINKO SOLAR CO., LTD., Zhejiang (CN)

(72) Inventors: Zhiqiu Guo, Jiaxing (CN); Shiliang Huang, Jiaxing (CN); Yingli Guan, Jiaxing (CN); Jingguo Yang, Jiaxing (CN)

(73) Assignees: JINKO SOLAR (HAINING) CO., LTD., Haining Zhejiang (CN); ZHEJIANG JINKO SOLAR CO., LTD., Haining Zhejiang (CN)

( * ) Notice: Subject to any disclaimer, the term of this patent is extended or adjusted under 35 U.S.C. 154(b) by 0 days.

(21) Appl. No.: 18/506,088

(22) Filed: Nov. 9, 2023

(65) Prior Publication Data
US 2024/0105871 A1    Mar. 28, 2024

Related U.S. Application Data

(63) Continuation of application No. 18/059,409, filed on Nov. 28, 2022, now Pat. No. 11,862,744.

(30) Foreign Application Priority Data

Sep. 28, 2022 (CN) .......................... 202211191178.X

(51) Int. Cl.
    *H10F 19/90* (2025.01)
    *H02S 40/36* (2014.01)
(52) U.S. Cl.
    CPC ............. *H10F 19/90* (2025.01); *H02S 40/36* (2014.12)

(58) Field of Classification Search
    CPC .................................. H01L 31/05; H02S 40/36
    See application file for complete search history.

(56) References Cited

U.S. PATENT DOCUMENTS

| 11,323,064 B2 | 5/2022 | Rendler |
| 2011/0315188 A1* | 12/2011 | Hong .................. H01L 31/0512 |
| | | 136/244 |

(Continued)

FOREIGN PATENT DOCUMENTS

| CN | 203983309 U | 12/2014 |
| CN | 107771359 A | 3/2018 |

(Continued)

OTHER PUBLICATIONS

Jinko Solar (Haining) Co., Ltd., et al., Notice of Allowance, U.S. Appl. No. 18/059,409, Oct. 10, 2023, 10 pgs.

(Continued)

*Primary Examiner* — Tae-Sik Kang
(74) *Attorney, Agent, or Firm* — USCH Law, PC

(57) ABSTRACT

The photovoltaic module includes at least one cell string, including multiple solar cell sheets, and adjacent solar cell sheets in the multiple solar cell sheets are connected to each other by multiple welding strips. In some embodiments, the photovoltaic module further includes multiple welding strips, where each of the multiple welding strips is in electrical contact with a corresponding bus bar, each of the multiple welding strips includes multiple bending portions arranged continuously along a second direction. In addition, along the second direction, an orthographic projection of a central line of each of the multiple welding strips on a back surface of the solar cell sheet coincides with an orthographic projection of a central line of the corresponding bus bar and/or an orthographic projection of a central line of each of (Continued)

the multiple bonding pads on the corresponding bus bar on the back surface of the solar cell sheet.

20 Claims, 5 Drawing Sheets

(56) References Cited

U.S. PATENT DOCUMENTS

| 2012/0291837 A1 | 11/2012 | Lin et al. |
| 2021/0111670 A1 | 4/2021 | Rendler |

FOREIGN PATENT DOCUMENTS

| CN | 207868206 U | 9/2018 |
| CN | 110476258 A | 11/2019 |
| CN | 110931586 A | 3/2020 |
| CN | 114628542 A | 6/2022 |
| EP | 2466648 A1 | 6/2012 |
| JP | H07135333 A | 5/1995 |
| JP | 2001345458 A | 12/2001 |
| JP | 2005302902 A | 10/2005 |
| JP | 2013016531 A | 1/2013 |
| JP | 2013521635 A | 6/2013 |
| JP | 2014175618 A | 9/2014 |
| JP | 2016072637 A | 5/2016 |
| JP | 2016122749 A | 7/2016 |
| JP | 2016171295 A | 9/2016 |
| JP | 2017011190 A | 1/2017 |
| JP | 2020070436 A | 5/2020 |
| JP | 2021136426 A | 9/2021 |
| WO | 2021232723 A1 | 11/2021 |
| WO | 2021244200 A1 | 12/2021 |

OTHER PUBLICATIONS

Jinko Solar (Haining) Co., Ltd., et al., Extended European Search Report, EP 22210940.7, Aug. 17, 2023, 7 pgs.

Jinko Solar (Haining) Co., Ltd., et al., AU Examination report No. 1 for your standard patent application, AU 2022279531, Oct. 30, 2023, 10 pgs.

Jinko Solar (Haining) Co., Ltd et al., JP Decision to Grant a Patent with English translation, JP 2022212185, Apr. 1, 2024, 5 pgs.

Jinko Solar (Haining) Co., Ltd. et al., JP Notice of Reasons for Refusal with English translation, JP 2024-002200, Jan. 9, 2025, 6 pgs.

Jinko Solar (Haining) Co., Ltd. et al., CN First Office Action, CN 202211191178X, Dec. 16, 2024, 15 pgs.

\* cited by examiner

PHOTOVOLTAIC MODULE AND METHOD FOR PREPARING THE PHOTOVOLTAIC MODULE

CROSS-REFERENCE TO RELATED APPLICATION

The present application is a continuation of U.S. patent application Ser. No. 18/059,409, filed on Nov. 28, 2022, which claims the benefit of priority to Chinese Patent Application No. 202211191178.X filed on Sep. 28, 2022, each of which is incorporated herein by reference in its entirety.

TECHNICAL FIELD

Embodiments of the present disclosure relate to the field of solar cells, and in particular to a photovoltaic module, and a method for preparing the photovoltaic module.

BACKGROUND

A solar cell has desirable photoelectric conversion capability, so that the solar cell is the center of development of clean energy. Since both positive metal electrodes and negative metal electrodes are disposed on a back surface of a full back-contact solar cell, and a front surface of the full back-contact solar cell is not shielded by grid lines, the loss of light shielding current of metal electrodes is eliminated, and the use of incident photons is maximized, the full back-contact solar cell has desirable prospects. Therefore, a photovoltaic module constructed by full back-contact solar cells has good desirable prospects.

However, in a current photovoltaic module design scheme, solar cell sheets are prone to crack, fragment, and other problems, which lead to low yield and high manufacturing costs of the photovoltaic module.

SUMMARY

Embodiments of the present disclosure provide a photovoltaic module and a method for preparing the photovoltaic module, which are at least beneficial to release the stress caused in electrical contact between a welding strip and a solar cell sheet, improve the yield and reduce manufacturing costs of the photovoltaic module.

A photovoltaic module is provided according to an embodiment of the present disclosure, the photovoltaic module includes: at least one cell string, where each of the at least one cell string includes multiple solar cell sheets, and each of the multiple solar cell sheets includes a substrate, and the substrate has:
  a front surface,
  a back surface opposite to the front surface,
  a first passivation layer disposed on the front surface of the substrate, and
  a second passivation layer disposed on the back surface of the substrate;
multiple bus bars disposed on a surface of the second passivation layer, where the multiple bus bars are disposed at intervals along a first direction and extend along a second direction, and each of the multiple bus bars includes multiple bonding pads disposed at intervals along the second direction and a bus bar connecting line;
multiple welding strips, where two adjacent solar cell sheets in the multiple solar cell sheets are connected to each other by one of the multiple welding strips, and each of the multiple welding strips is in electrical contact with a corresponding bus bar, and each of the multiple welding strips includes multiple bending portions arranged continuously along the second direction; along the second direction, an orthographic projection of a central line of each of the multiple welding strips on a back surface of the solar cell sheet coincides with an orthographic projection of a central line of the corresponding bus bar on the back surface of the solar cell sheet and/or an orthographic projection of a central line of each of the multiple bonding pads on the corresponding bus bar on the back surface of the solar cell sheet; and
at least one package layer and at least one cover plate, where after the at least one package layer is disposed on a surface of the at least one cell string, and the at least one cover plate is disposed on a surface of the at least one package layer away from the at least one cell string, the at least one package layer and the at least one cover plate are laminated.

In some embodiments, along the second direction, adjacent bending portions in the multiple bending portions are bent in a same direction or opposite directions.

In some embodiments, the multiple bending portions are bent in a shape of arc, zigzag or broken line.

In some embodiments, each of the multiple bonding pads is in electrical contact with two adjacent bending portions in the multiple bending portions on each of the multiple welding strips.

In some embodiments, each of the multiple bending portions includes a first bending portion in electrical contact with a corresponding bonding pad in the multiple bonding pads and a second bending portion not in electrical contact with any of the multiple bonding pads; along a third direction, the first bending portion is bigger than the second bending portion in size, and the third direction is perpendicular to a bending direction of each of the multiple bending portions.

In some embodiments, in a fourth direction, a distance between a bending vertex of each of the multiple bending portions away from a corresponding bus bar and the corresponding bus bar ranges from 0.1 mm to 0.3 mm, and the fourth direction is perpendicular to the second direction.

In some embodiments, a ratio of a length of each of the multiple bending portions in a bending direction to a length of each of the multiple bending portions along the second direction ranges from 1.05 to 1.25.

In some embodiments, the multiple bending portions are the same in length along the second direction.

In some embodiments, each of the multiple welding strips is in a plane parallel to the back surface of the solar cell sheet.

Correspondingly, a method for preparing the photovoltaic module is provided according to an embodiment of the present disclosure, the method includes: providing at least one cell string, where each of the at least one cell string includes multiple solar cell sheets, and each of the multiple solar cell sheets includes a substrate, and the substrate has:
  a front surface,
  a back surface opposite to the front surface,
  a first passivation layer disposed on the front surface of the substrate, and
  a second passivation layer disposed on the back surface of the substrate;
providing multiple bus bars, where the multiple bus bars are disposed on a surface of the second passivation layer, and the multiple bus bars are disposed at intervals along a first direction and extend along a second direction, and each of the multiple bus bars includes multiple bonding pads disposed at intervals along the second direction and a bus bar connecting line;

providing multiple welding strips, continuously shaping each of the multiple welding strips by a shaping process to shape multiple bending portions arranged continuously along the second direction, where two adjacent solar cell sheets in the multiple solar cell sheets are connected to each other by one of the multiple welding strips, and each of the multiple welding strips is in electrical contact with a corresponding bus bar; along the second direction, an orthographic projection of a central line of each of the multiple welding strips on a back surface of the solar cell sheet coincides with an orthographic projection of a central line of the corresponding bus bar on the back surface of the solar cell sheet and/or an orthographic projection of a central line of each of the multiple bonding pads on the corresponding bus bar on the back surface of the solar cell sheet;

providing at least one package layer and at least one cover plate, where after the at least one package layer is disposed on a surface of at least one cell string, and the at least one cover plate is disposed on a surface of the at least one package layer away from the at least one cell string, the at least one package layer and the at least one cover plate are laminated.

In some embodiments, the shaping process includes pressing, bending, forging, or stamping.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated.

DETAILED DESCRIPTION

Figure 1:
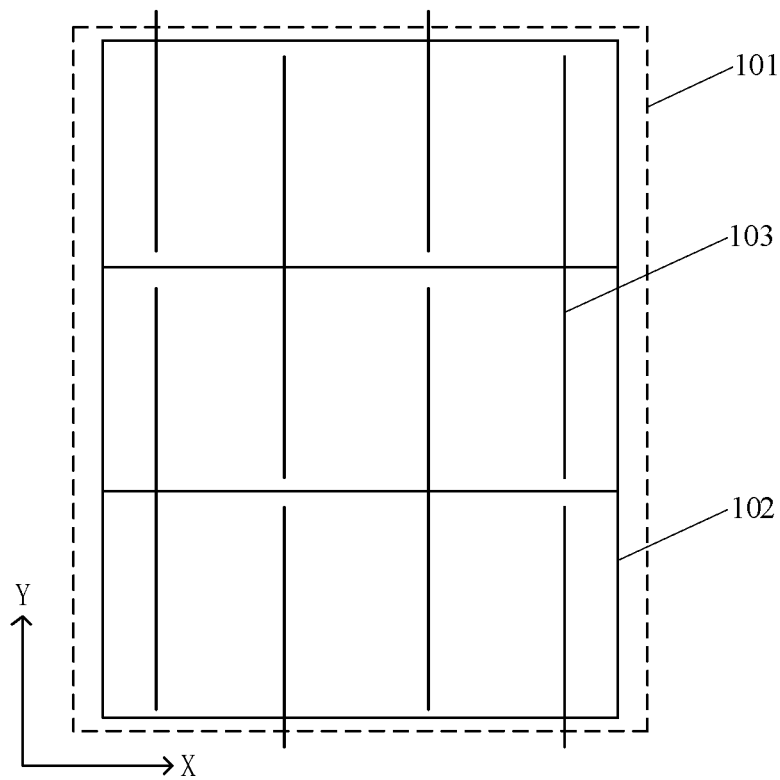
FIG. 1 is a schematic structural view of a cell string provided according to an embodiment of the present disclosure.

It is known from the background technology that the photovoltaic module in the background technology is prone to crack or fragment of the solar cell sheet, which leads to low yield and high manufacturing cost of the photovoltaic module.

A photovoltaic module is provided according to an embodiment of the present disclosure. In the process of using multiple full back-contact solar cells to construct a cell string, after multiple full back-contact solar cell sheets are disposed in order, the welding strip composed of multiple bending portions arranged continuously is used to connect the adjacent solar cell sheets, the multiple bending portions are used as buffer joints to fully release the stress in the process of connecting the solar cell sheets with the welding strips, so that warping of the solar cell sheets is avoided, the reliability and yield of the cell string are improved. In the process of connecting adjacent solar cell sheets by using the welding strips, along the second direction, the orthographic projection of the central line of each of the multiple welding strips on a back surface of the solar cell sheet is aligned with the orthographic projection of the central line of the corresponding bus bar on the back surface of the solar cell sheet and/or the orthographic projection of the central line of each of the multiple bonding pads on the corresponding bus bar on the back surface of the solar cell sheet, so that the orthographic projection of the central line of each of the multiple welding strips on the back surface of the solar cell sheet coincides with the orthographic projection of the central line of the corresponding bus bar on the back surface of the solar cell sheet and/or the orthographic projection of the central line of each of the multiple bonding pads on the corresponding bus bar on the back surface of the solar cell sheet. After that, the welding strip is in electrical contact with the corresponding bus bar to complete the production of the cell string. By aligning the orthographic projection of the central line of each of the multiple welding strips on the back surface of the solar cell sheet with the orthographic projection of the central line of the corresponding bus bar on the back surface of the solar cell sheet and/or the orthographic projection of the central line of each of the multiple bonding pads on the corresponding bus bar on the back surface of the solar cell sheet, the aesthetic degree and connection effect when using the welding strips to connect the solar cell sheets are guaranteed, and the rise of contact resistance caused by the deviation of the welding strip from the bus bar area is avoided, so that the efficiency of the cell string can be prevented from being affected.

The embodiments of the present disclosure will be described in detail below with reference to the accompanying drawings. However, those of ordinary skill in the art shall understand that, in each embodiment of the present disclosure, many technical details are provided for readers to better understand the present disclosure. However, the technical solutions claimed in the present disclosure can be realized even without these technical details and various changes and modifications based on the following embodiments.

Figure 2:
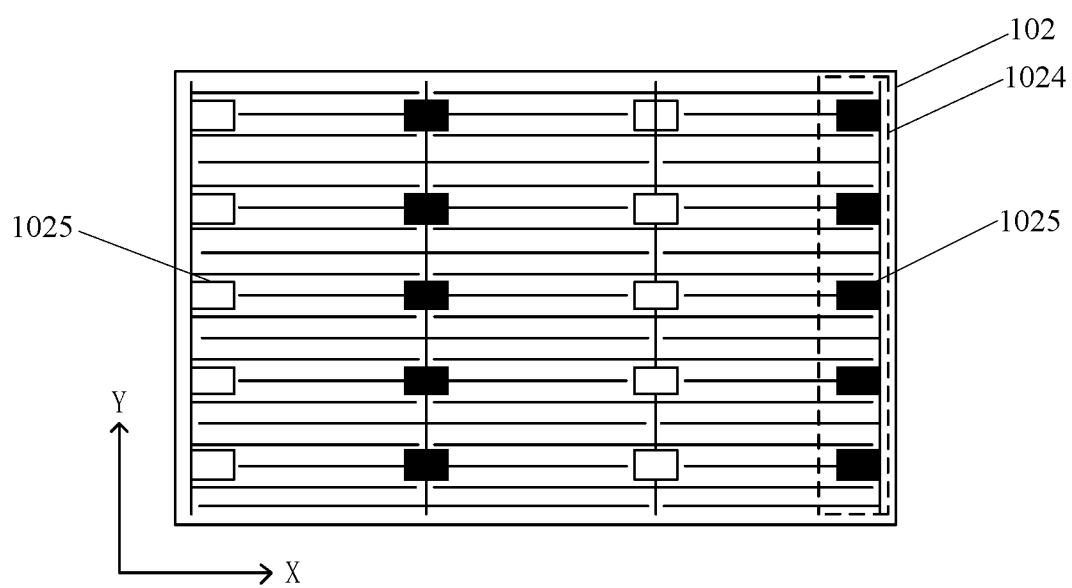
FIG. 2 is a schematic structural view of grid lines of a solar cell sheet provided according to an embodiment of the present disclosure.
Figure 3:
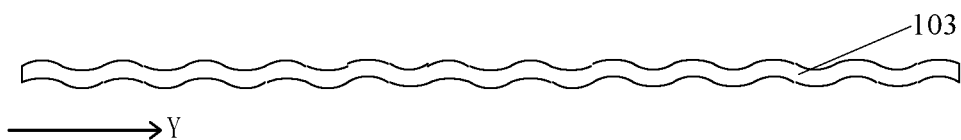
FIG. 3 is a schematic structural view of a welding strip provided according to an embodiment of the present disclosure.
Figure 4:
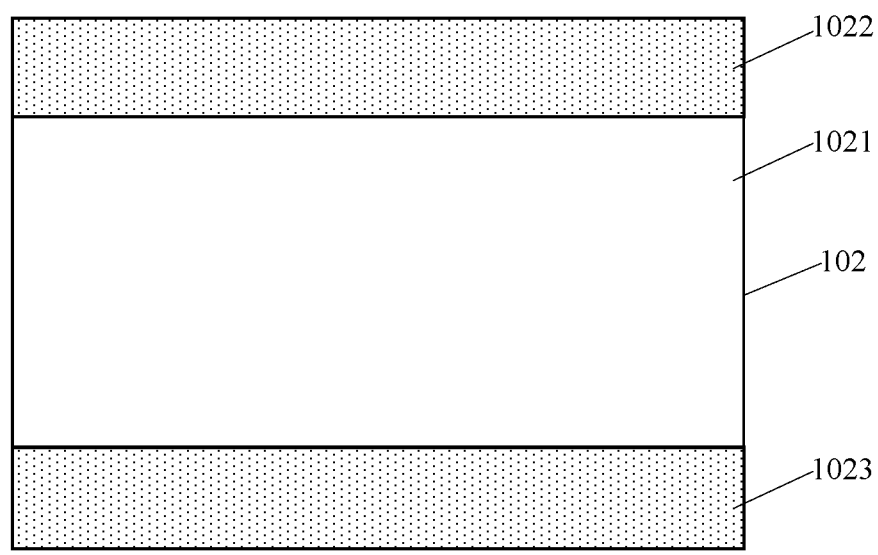
FIG. 4 is a schematic structural view of a solar cell sheet provided according to an embodiment of the present disclosure.
Figure 7:
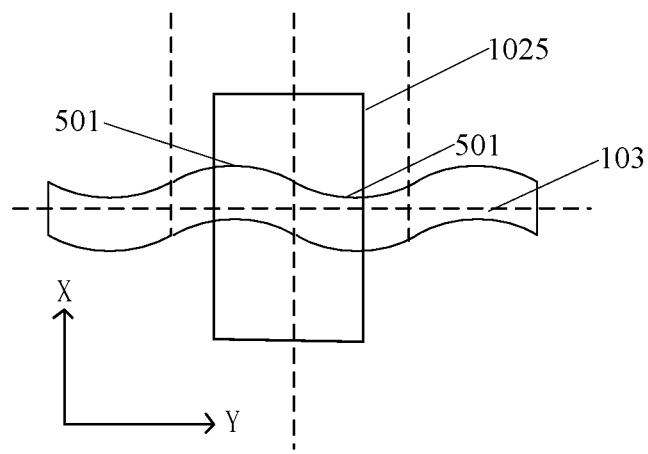
FIG. 7 is a schematic structural view of an electrical contact between a welding strip and a bonding pad provided according to an embodiment of the present disclosure.
Figure 8:
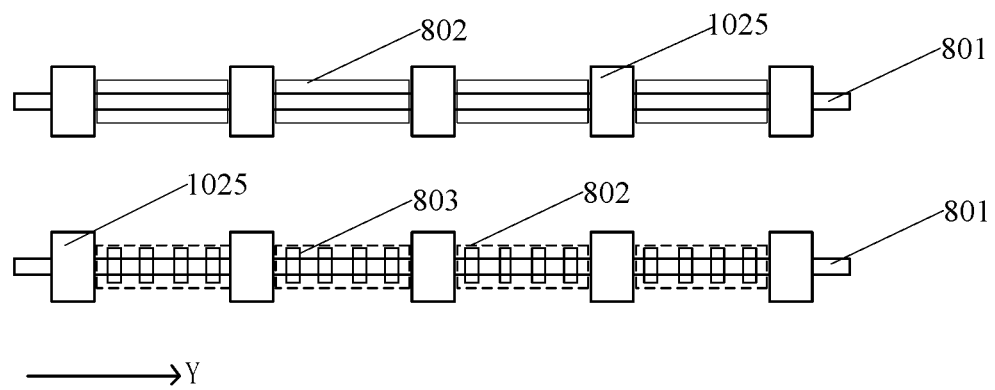
FIG. 8 is a schematic structural view of a bus bar including a solder resist area provided according to an embodiment of the present disclosure.
Figure 12:
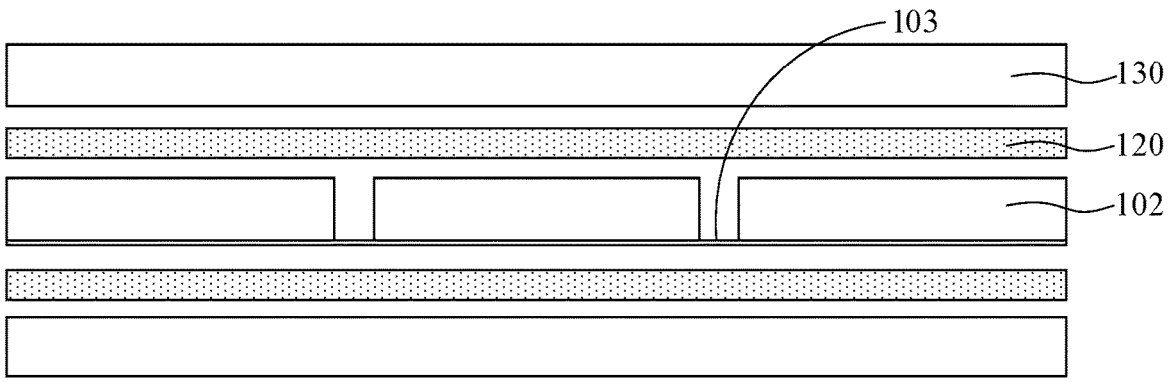
FIG. 12 is a schematic structural view of a photovoltaic module provided according to an embodiment of the present disclosure.

Reference is made to FIG. 1 to FIG. 4, where FIG. 1 is a schematic structural view of a cell string 101 provided according to an embodiment of the present disclosure, FIG. 2 is a schematic structural view of grid lines of a solar cell sheet 102 provided according to an embodiment of the present disclosure, FIG. 3 is a schematic structural view of a welding strip 103 provided according to an embodiment of the present disclosure, and FIG. 4 is a schematic structural view of the solar cell sheet 102 provided according to an embodiment of the present disclosure. The photovoltaic module includes: at least one cell string 101, where each of the at least one cell string 101 includes multiple solar cell sheets 102, and each of the multiple solar cell sheets 102 includes a substrate 1021, and the substrate 1021 has a front surface, a back surface opposite to the front surface, a first passivation layer 1022 disposed on the front surface of the substrate 1021, and a second passivation layer 1023 disposed on the back surface of the substrate 1021. The photovoltaic module further includes multiple bus bars 1024 disposed on a surface of the second passivation layer 1023, where the multiple bus bars 1024 are disposed at intervals along a first direction and extend along a second direction. Referring to FIG. 8, each of the multiple bus bars 1024 includes multiple bonding pads 1025 disposed at intervals along the second direction and a bus bar connecting line 801. Referring back to FIG. 1 to FIG. 4, the photovoltaic module further includes multiple welding strips 103, where two adjacent solar cell sheets 102 in the multiple solar cell sheets 102 are connected to each other by one of the multiple welding strips 103, and each of the multiple welding strips 103 is in electrical contact with a corresponding bus bar 1024, and each of the multiple welding strips 103 includes multiple bending portions arranged continuously along the second direction. Referring to FIG. 7, and along the second direction, an orthographic projection of a central line of each of the multiple welding strips 103 on a back surface of the solar cell sheet 102 coincides with an orthographic projection of a central line of the corresponding bus bar 1024 on the back surface of the solar cell sheet 102 and/or an orthographic projection of a central line of each of the multiple bonding pads 1025 on the corresponding bus bar 1024 on the back surface of the solar cell sheet 102. Referring to FIG. 12, the photovoltaic module further includes at least one package layer 120 and at least one cover plate 130, where after the at least one package layer 120 is disposed on a surface of the at least one cell string 101, and the at least one cover plate 130 is disposed on a surface of the at least one package layer 120 away from the at least one cell string 101, the at least one package layer 120 and the at least one cover plate 130 are laminated. In Figures, the first direction is shown as X direction, and the second direction is shown as Y direction.

It should be understood that an exemplary example of the electrical contact between the welding strip 103 and the bus bar 1024 is shown in the above embodiment. In specific disclosures, the possible deviation of each of the multiple bonding pads 1025 during the manufacturing of the bus bar 1024 and the difficulty of fully aligning the central lines are considered, in response to aligning the orthographic projection of the central line of each of the multiple welding strips 103 on the back surface of the solar cell sheet 102 with the orthographic projection of the central line of the corresponding bus bar 1024 on the back surface of the solar cell sheet 102 and/or the orthographic projection of the central line of each of the multiple bonding pads 1025 on the corresponding bus bar 1024 on the back surface of the solar cell sheet 102, a certain coincidence deviation is allowed between the central lines. For example, along a direction perpendicular to the second direction, there is allowed to be a 10% or 20% deviation between the central lines, that is, a coincidence area of the central lines ranges from 80% to 90% of the total area of the central lines, so that the disclosure difficulty of the scheme is reduced while ensuring the electrical contact effect as much as possible.

In the process of using multiple full back-contact solar cells, in which multiple bus bars 1024 are all disposed on the second passivation layer 1023 on the back surface of the solar cell sheet 102, to construct the cell string 101, the welding strip 103 composed of multiple bending portions arranged continuously is used to connect the adjacent solar cell sheets 102, so that when welding each of the multiple bonding bands 103 to a corresponding bus bar 1024 to realize electrical contact, multiple bending portions of the welding strip 103 are used as buffer joints to fully release the stress caused by different welding stresses respectively formed in the welding strip 103 and the solar cell sheet 102 due to the welding strip 103 and the solar cell sheet 102 have different thermal expansion coefficient, to ensure the welding quality of adjacent solar cell sheet 102 done by the welding strip 103, avoid warping of the solar cell sheets 102, and improve the reliability and yield of the cell string 101. In the process of electrical contacting the welding strip 103 with the corresponding bus bar 1024, along the second direction, the orthographic projection of the central line of each of the multiple welding strips 103 on a back surface of the solar cell sheet 102 is aligned with the orthographic projection of the central line of the corresponding bus bar 1024 on the back surface of the solar cell sheet 102 and/or the orthographic projection of the central line of each of the multiple bonding pads 1025 on the corresponding bus bar 1024 on the back surface of the solar cell sheet 102. After the orthographic projection of the central line of each of the multiple welding strips 103 on the back surface of the solar cell sheet 102 coincides with the orthographic projection of the central line of the corresponding bus bar 1024 on the back surface of the solar cell sheet 102 and/or the orthographic projection of the central line of each of the multiple bonding pads 1025 on the corresponding bus bar 1024 on the back surface of the solar cell sheet 102, each of the multiple welding strip 103 is in electrical contact with the corresponding bus bar 1024 by electrical connection process, such as welding, to connect adjacent solar cell sheets 102 together to form the cell string 101. By aligning the orthographic projection of the central line of each of the multiple welding strips 103 on the back surface of the solar cell sheet 102 with the orthographic projection of the central line of the corresponding bus bar 1024 on the back surface of the solar cell sheet 102 and/or the orthographic projection of the central line of each of the multiple bonding pads 1025 on the corresponding bus bar 1024 on the back surface of the solar cell sheet 102, the aesthetic degree and connection effect when using the welding strips 103 to connect the solar cell sheets 102 are guaranteed, and the rise of contact resistance caused by the deviation of the welding strip 103 from the area where the bus bar 1024 is located is avoided, so that the efficiency of the cell string 101 can be prevented from being affected.

The substrate 1021 is configured to receive incident light and generate photogenerated carriers. In some embodiments, the substrate 1021 may be embodied as a silicon substrate, and the silicon substrate is made of at least one of monocrystalline silicon, polycrystalline silicon, amorphous silicon, or microcrystalline silicon. In other embodiments, the substrate 1021 may also be made of silicon carbide, organic material, or multi-component compound. The multi-component compound includes, but is not limited to, perovskite, gallium arsenide, cadmium telluride, copper indium selenium and other materials.

In addition, the first direction and the second direction are perpendicular to each other, or there may be an included angle of less than 90 degrees between the first direction and the second direction, for example, 60 degrees, 45 degrees, 30 degrees, as long as the first direction and the second direction are different directions. For the convenience of explanation and understanding, an embodiment in which the first direction and the second direction are perpendicular to each other is taken as an example. In specific disclosures, the included angle between the first direction and the second direction can be adjusted according to actual needs and disclosure scenarios, which will not be limited thereto.

Figure 5:
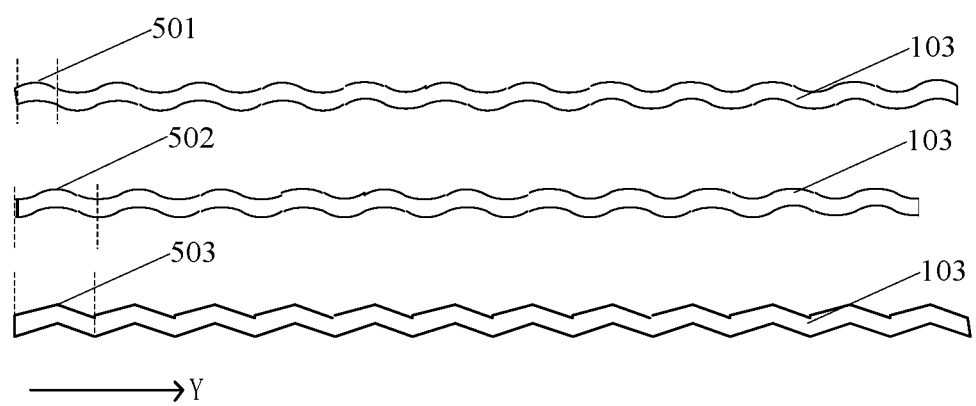
FIG. 5 is a schematic structural view of a variety of welding strips formed by different bending portions provided according to an embodiment of the present disclosure.

In some embodiments, the bending portion is in a shape of an arc, a zigzag or a broken line. Reference is made to FIG. 2 and FIG. 5, where FIG. 5 a schematic structural view of a variety of welding strips 103 formed by different bending portions, such as arc bending portions 501, zigzag bending portions 502, and broken line bending portions 503, provided according to an embodiment of the present disclosure.

In the process of shaping the welding strip 103, the shape of the bending portion formed by shaping can be set according to the needs of the disclosure scenarios. For example, in response to a difference between a thermal expansion coefficient of each of the multiple solar cell sheets 102 and a thermal expansion coefficient of each of the multiple welding strips 103 being big, in order to improve the stress release capacity of each bending portion on the welding strip 103 as much as possible, in response to the bending degree is consistent, that is, in response to a distance between each bending vertex farthest from the central line of each of the multiple welding strip 103 and the central line of each of the multiple welding strip 103 being consistent along the second direction, the bending portions can be in the shape of arc or zigzag. In this way, a ratio of the length of each of the multiple bending portions in a bending direction to the length of each of the multiple bending portions along the first direction is raised as much as possible, to improve the stress release capacity of the multiple bending portions. In response to the difference between the thermal expansion coefficient of each of the multiple solar cell sheets 102 and the thermal expansion coefficient of each of the multiple welding strips 103 being small, and other conditions such as bending degree are consistent, in order to reduce the coverage area of the welding strip 103 on the back surface of the solar cell sheet 102 as much as possible, the bending portions can be in a shape of broken line, such as triangle, rectangle or trapezoid, so that short circuit caused by the contact between the welding strip 103 and the finger on the back surface of the solar cell sheet 102 is avoided, to ensure the insulation of cell string 101. In response to other conditions being consistent, and reducing the coverage area of the welding strip 103 on the back surface of the solar cell sheet 102 while ensuring the stress release capacity of the welding strip 103, the bending portion can be in a shape an arc, in which the welding strip 103 occupies a relative smaller area of the back surface of the solar cell sheet 102. In response to improving the stress release capacity of the welding strip 103 as much as possible, the bending portion can be in a shape of a zigzag, in which the welding strip 103 occupies a relative larger area of the back surface of the solar cell sheet 102. According to the disclosure scenarios and requirements, the welding strip 103 is formed by shaping the multiple bending portions to an appropriate shape selected from the above shapes, to ensure the adaptability of the welding strip 103 to different disclosure scenarios and requirements.

It should be understood that the arc shape in the above shapes of the multiple bending portions may be an arc, an elliptical arc or an irregular arc formed by multiple arcs. The broken line shape may be a triangle, rectangle, trapezoid or other figure composed of multiple broken lines. The zigzag shape may be a smooth figure composed of multiple arcs, or a figure composed of multiple broken lines and multiple arcs, or a figure similar to a normal distribution curve. The specific structure of the multiple bend portions with different shapes is not limited thereto.

Figure 6:
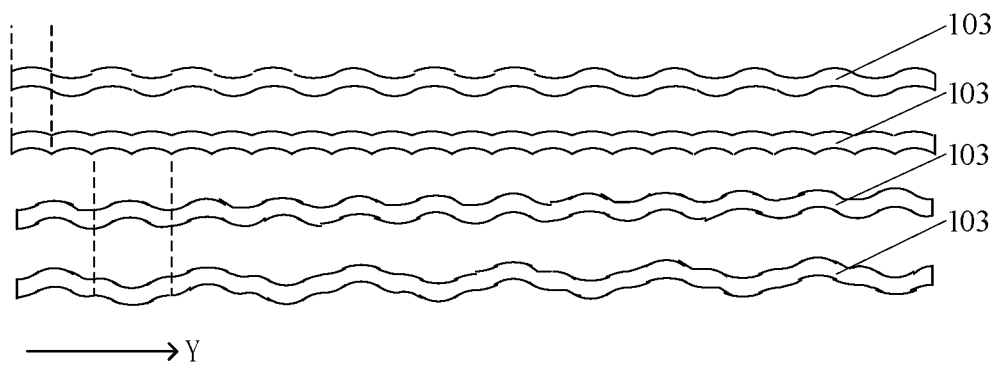
FIG. 6 is a schematic structural view of another variety of welding strips formed by different bending portions provided according to an embodiment of the present disclosure.

In some embodiments, the bending directions of adjacent bending portions are the same or opposite along the second direction. Reference is made to FIG. 6, which is a schematic structural view of another variety of welding strips 103 formed by different bending portions, in which along the second direction, adjacent bending portions in the arc shape are bent in the same direction or opposite directions, adjacent bending portion in the zigzag shape are bent in the same direction or opposite directions, provided according to an embodiment of the present disclosure.

In the process of shaping the welding strip 103, a relationship between the bending directions of adjacent bending portions can be adjusted as needed. In response to other conditions such as the bending degree and the width of the welding strip 103 being consistent, in order to minimize the coverage area of the welding strip 103 on the back surface of the solar cell sheet 102, two adjacent bending portions can be bent in the same bending direction in the process of shaping the welding strip 103, so that the coverage area of the welding strip 103 on the back surface of the solar cell sheet 102 is reduced, and the contact between the welding strip 103 and the finger on the back surface of the solar cell sheet 102 is minimized, so as to avoid short circuit on the solar cell sheet 102. In order to make the welding strip 103 have a desirable stress release effect, in the process of shaping the welding strip 103, the two adjacent bending portions can be bent in opposite bending directions. Since bending portions with different bending directions in each of the multiple welding strips 103 are alternately arranged, the multiple bending portions in each of the multiple welding strips 103 have a desirable stress release effect in more directions, and the overall shape of the welding strip 103 will be as smooth and beautiful as possible. Therefore, the bending directions of adjacent bending portions in the weld strip 103 can be set to be the same or opposite to adapt to different disclosure scenarios and requirements.

It should be understood that, in order to facilitate understanding, the embodiments of the present disclosure, in which the relationship between bending directions of adjacent bending portions are consistent, are taken as examples to perform illustration. However, in specific disclosures, along the second direction, the relationship between the bending directions of adjacent bending portions in the welding strip 103 may be consistent, that is, the bending directions of adjacent bending portions are the same or opposite. The relationship between the bending directions of adjacent bending portions may also be inconsistent, that is, the bending directions of some adjacent bending portions are the same, while the bending directions of some adjacent bending portions are opposite, which are not limited thereto.

In some embodiments, each bonding pad 1025 is electrically contacted with two adjacent bending portions on the welding strip 103. Referring to FIG. 2 and FIG. 7, the welding strip 103 is composed of adjacent arc bending portions 501 with opposite bending directions. Each bonding pad 1025 contacts two adjacent bending portions on the welding strip 103. Along the first direction, intersection line of the two adjacent arc bending portions 501 coincides with the central line of the bonding pad 1025. That is to say, before the welding strip 103 is electrical contacted with the bus bar 1024, after the orthographic projection of the central line of the welding strip 103 on the back surface of the solar cell sheet 102 is aligned with the orthographic projection of the central line of the corresponding bus bar 1024 on the back surface of the solar cell sheet 102 and/or the orthographic projection of the central line of each of the multiple bonding pads 1025 on the corresponding bus bar 1024 on the back surface of the solar cell sheet 102 along the second direction, the intersection line between the adjacent bending portions connected with the bonding pad 1025 is aligned with the central line of the bonding pad 1025 along the direction perpendicular to the second direction. Subsequently, the bonding pad 1025 is electrical contacted with the two adjacent bending portions by the electrical connection process to complete the electrical contact between the welding strip 103 and the corresponding bus bar 1024. Since the bonding pad 1025 is electrically contacted with both two adjacent bending portions, in response to the welding strip 103 and the solar cell sheet 102 having different shrinkage due to the difference in thermal expansion coefficient, the bonding pad 1025 can directly release the stress generated by the different shrinkage of the welding strip 103 and the solar cell sheet 102 through the two adjacent bending portions electrically in contact with the bonding pad 1025 to improve the capacity and effect of stress release.

It should be understood that in the above embodiment, only a schematic structural view of electrical contact between the bonding pad 1025 and the welding strip 103 is given. In the process of electrical contact between bonding pad 1025 and two adjacent bending portions in welding strip 103, the difficulty of implementation, mechanical error and other factors are taken into consideration. Along the direction perpendicular to the second direction, not only the intersection line between bending portions is aligned with the central line of bonding pad 1025, but also the position relationship between the intersection line between bending portions and the central line of the bonding pad 1025 is set to be not completely coincident with each other or apart from each other. For example, the coincidence area of the central line of the bonding pad 1025 and the intersection line of adjacent bending portion occupies 90%, 80% or 50% of the total area, or along the second direction, a distance between the intersection line of the adjacent bending portions and the central line is 10%, 20% or 45% of the maximum length of the bonding pad 1025. On the basis of ensuring the effect of stress release, the difficulty of implementing electrical contact between the welding strip 103 and the bonding pad 1025 is reduced. In this embodiment, in response to the bonding pad 1025 being electrical contacted with two adjacent bending portions on the welding strip 103, the specific position relationship between the intersection line between the bending portions and the central line of the bonding pad 1025 along the second direction is not limited.

In addition, referring to FIG. 2 and FIG. 8, the bus bar 1024 includes a bus bar connecting line 801 and the bonding pad 1025. In order to avoid the electrical contact between the finger on the back surface of the solar cell sheet 102 and a heteropolarity bus bar 1024 with opposite polarity to the finger, or between the finger and the welding strip 103 corresponding to the heteropolarity bus bar 1024 with opposite polarity to the finger, the bus bar 1024 on the back surface of each solar cell sheet 102 can also be solder resisted in advance before the connection of the solar cell sheets 102 is performed. With each bonding pad 1025 on the bus bar 1024 as a partition, the bus bar connecting line 801 is divided into multiple solder resist areas 802 arranged along the second direction, and the multiple solder resist areas 802 are processed by printing or dispensing with solder resist ink, such as insulating glue. During the solder resist processing, solder resist ink can be used to completely cover each of the multiple solder resist areas 802, or multiple solder resist sub areas 803 can be divided in each of the multiple solder resist areas 802. Each of the multiple solder resist sub areas 803 is completely covered, and the position of each of the multiple solder resist sub areas 803 corresponds to the position of a heteropolarity finger with opposite polarity to the bus bar 1024, to avoid contact between the welding strip 103 and the bus bar 1024, and between the welding strip 103 and the finger with opposite polarity to the bus bar 1024. In the process of solder resist processing, the size of solder resist ink should be 15 μm or above higher than the height of solder resist area 802 or solder resist sub area 803, and be 50 μm or above wider than the width of solder resist area 802 or solder resist sub area 803, which will not be limited thereto.

Figure 9:
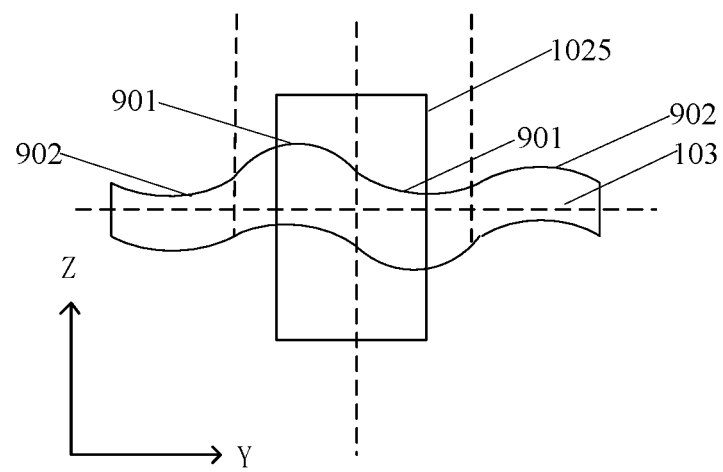
FIG. 9 is a schematic structural view of another electrical contact between the welding strip and the bonding pad provided according to an embodiment of the present disclosure.

Reference is made to FIG. 2 and FIG. 9, where the third direction is the Z direction. In some embodiments, each of the multiple bending portions includes a first bending portion 901 in electrical contact with the bonding pad 1025 and a second bending portion 902 not in electrical contact with the bonding pad 1025. Along the third direction, the size of the first bending portion 901 is larger than that of the second bending portion 902, and the third direction is perpendicular to the bending direction of the multiple bending portions.

The welding strip 103 is mainly configured to connect adjacent solar cell sheets 102, and transmit the current collected on the bus bar 1024 in electrical contact with the welding strip 103 to a component end connected with the cell string 101. The current transmission capability of the welding strip 103 is related to its own resistance and the contact resistance between the welding strip 103 and the bus bar 1024. In response to the welding strip 103 being in electrical contact with the bus bar 1024 by each of the multiple bonding pads 1025 on the bus bar 1024, the contact resistance between the welding strip 103 and the bus bar 1024 is related to the contact area between the welding strip 103 and the bonding pad 1025.

Therefore, in the process of shaping the welding strip 103 to form bending portions, the welding strip 103 is shaped into multiple bending portions arranged continuously along the second direction, and the welding strip 103 is aligned with the corresponding bus bar 1024 to determine the first bending portion 901 in electrical contact with the bonding pad 1025 and the second bending portion 902 not in electrical contact with the bonding pad 1025 in the welding strip 103. Along the third direction, the sizes of the first bending portion 901 and the second bending portion 902 refer to their widths along the third direction, respectively. Therefore, the third direction is a direction parallel to the back surface of the solar cell sheet 102 and perpendicular to the second direction. In response to an original width of the welding strip 103 before shaping along a direction perpendicular to the extension direction being relatively small, the first bending portion 901 is stretched along the third direction perpendicular to the bending direction, so that the size of the first bending portion 901 is larger than the size of the second bending portion 902 along the third direction of the welding strip 103. In response to the original width of the welding strip 103 before shaping along the direction perpendicular to the extension direction being relatively large, the second bending portion 902 is compressed along the third direction perpendicular to the bending direction, so that the size of the first bending portion 901 is larger than the size of the second bending portion 902 along the third direction. The first bending portion 901 or the second bending portion 902 in the welding strip 103 are reshaped for the second time, so that the size of the first bending portion 901 is larger than the size of the second bending portion 902 along the third direction perpendicular to the bending direction, and the adjacent first bending portions 901 are connected to the corresponding bonding pad 1025 to complete the electrical contact between the welding strip 103 and the corresponding bus bar 1024.

Along the third direction perpendicular to the bending direction, in the welding strip 103, the size of the first bending portion 901 in electrical contact with the bonding pad 1025 is set to be larger, so that the electrical contact area between the welding strip 103 and the bonding pad 1025 is enhanced, which reduces the contact resistance between the welding strip 103 and the bonding pad 1025, thereby improving the current transmission capability of the welding strip 103 and ensuring the working efficiency of the cell string 101.

Figure 10:
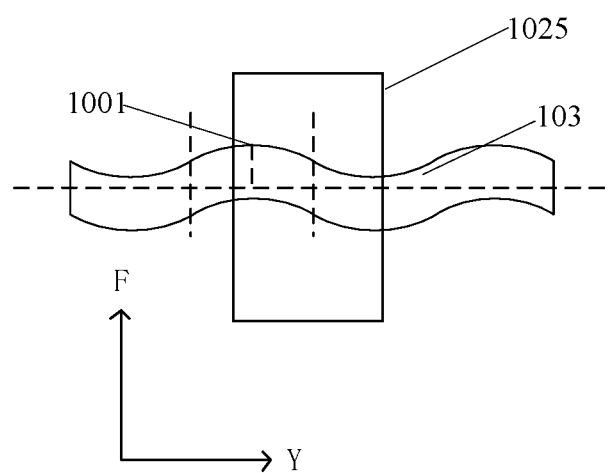
FIG. 10 is a schematic structural view of yet another electrical contact between the welding strip and the bonding pad provided according to an embodiment of the present disclosure.

Referring to FIG. 2 and FIG. 10, the fourth direction is the F direction. In some embodiments, along the fourth direction, a distance between a bending vertex 1001 of the bending portion away from the bus bar 1024 and the bus bar 1024 ranges from 0.1 mm to 0.3 mm, and the fourth direction is perpendicular to the second direction.

In FIG. 10, the welding strip 103 is composed of arc bending portions, in which adjacent bending portions are bent in opposite bending directions. Along the fourth direction, the distance between the bending vertex 1001 of the bending portion and the bus bar 1024 is the minimum distance between the orthographic projection of the bending vertex 1001 on the solar cell sheet 102 and the central line of the orthographic projection of the bus bar 1024 on the back surface of the solar cell sheet 102, that is, the fourth direction is a direction parallel to the back surface of the solar cell sheet 102 and perpendicular to the second direction. Along the fourth direction, in response to the distance between the bending vertex 1001 and the bus bar 1024 being too small, the bending degree of the bending portion is low, which will reduce the capability of the bending portion to release the stress generated between the welding strip 103 and the solar cell sheet 102, and it is easy to cause the solar cell sheet 102 to warp or even break due to the ineffective release of the stress, thereby affecting the yield and production cost of the cell string 101. In response to the distance between the bending vertex 1001 and bus bar 1024 being excessive, the bending degree of the bending portion is also excessive, and the capability of the bending portion to release the stress generated between the welding strip 103 and the solar cell sheet 102 exceeds the demand. In addition, the overall length of the welding strip 103 is too excessive, which reduces the current transmission capability of the welding strip 103. In response to the bending degree being excessive, the welding strip 103 is easy to be in electrical contact with the heteropolarity finger with opposite polarity to the bus bar 1024, on the back surface of the solar cell sheet 102, which affects the insulation of the solar cell sheet 102.

Therefore, along the fourth direction, in the welding strip 103, the distance between the bending vertex 1001 away from the bus bar 1024 and the bus bar 1024 is set to range from 0.1 mm to 0.3 mm, such as 0.15 mm, 0.2 mm or 0.25 mm, so that the bending portion can effectively release the stress generated between the welding strip 103 and the solar cell sheet 102 to improve the yield of the cell string 101, while ensuring the current transmission capability of the welding strip 103 and the insulation of the solar cell sheet 102.

In some embodiments, the ratio of the length of the bending portion along the bending direction to the length of the bending portion along the second direction ranges from 1.05 to 1.25. The core function of the bending portion is to release the stress generated between the welding strip 103 and the solar cell sheet 102 as a buffer. The stress release capacity of the bending portion is not only related to the bending degree of the bending portion itself, but also to the ratio of the length of the bending portion along the bending direction to the length of the bending portion along the extension direction, that is, to the ratio of the length of the bending portion along the bending direction to the length of the bending portion along the second direction. In response to other conditions being consistent, and the ratio of the length of the bending portion along the bending direction to the length of the bending portion along the second direction being too small, the stress that the bending portion can release will be quite limited, which limits the capability of the bending portion to release the stress generated between the welding strip 103 and the solar cell sheet 102, resulting in limited stress release effect, and the solar cell sheet 102 is still prone to warp or even crack, the yield and production cost of cell string 101 is affected. In response to the ratio of the length of the bending portion along the bending direction to the length of the bending portion along the second direction being excessive, the bending portion can release a large amount of stress, and the capability of the bending portion to release the stress generated between the welding strip 103 and the solar cell sheet 102 exceeds the demand. In addition, the overall length of the welding strip 103 is excessive, which reduces the current transmission capability of the welding strip 103, and increases the production cost of the cell string 101.

Therefore, in the welding strip 103, the ratio of the length of the bending portion along the bending direction to the length of the bending portion along the second direction is set to range from 1.05 to 1.25, such as 1.10, 1.15 or 1.20, so that the bending portion can effectively release the stress generated between the welding strip 103 and the solar cell sheet 102 to improve the yield of the cell string 101, while ensuring the current transmission capability of the welding strip 103, and avoiding the problem of high production cost of the cell string 101.

In some embodiments, multiple bending portions have the same length along the second direction. As described in the above embodiments, the core function of the bending portion is to release the stress generated between the welding strip 103 and the solar cell sheet 102 as a buffer joint. The bus bar 1024 on the solar cell sheet 102 is generally made of the same material. In response to the welding strip 103 being in electrical contact with the bus bar 1024, the stress to be released at each contact position is basically the same. Therefore, the length of each bending portion along the second direction can be consistent, the regular distribution and the same specification of the bending portion are also conducive to the shaping and production of the welding strip 103 while ensuring the stress release effect and the aesthetic degree, wo that the shaping difficulty of the welding strip 103 is reduced, thereby improving the shaping and production efficiency.

It should be understood that in response to the solar cell sheet 102 having a special structure or requirement, the length of a specific part of the bending portion along the second direction can also be set separately according to the requirements of the disclosure scenario. In addition, the production efficiency, and the difficulty and accuracy of actual production are taken into consideration, there may be a certain deviation between the length of each bending portion along the second direction and a preset standard length, for example, the deviation between the actual length and the standard length may be 5%, 10%, 15%, which will not be limited thereto.

In some embodiments, the plane of each welding strip 103 is parallel to the back surface of the solar cell sheet 102. In the process of shaping the welding strip 103, on the plane parallel to the back surface of the solar cell sheet 102, multiple bending portions continuously arranged along the extension direction are formed. In the process of connecting the solar cell sheets 102 with the welding strip 103, the plane of each bending portion of the welding strip 103 are placed parallel to the back surface of the solar cell sheet 102, and the welding strip 103 is in electrical contact with the bus bar 1024 by the electrical connection process. The plane of the welding strip 103 is placed parallel to the back surface of the solar cell sheet 102, so that a protrusion or a recess portion on the welding strip 103 in the direction perpendicular to the back surface of the solar cell sheet 102 is avoided, and the problem of the maximum height of the cell string 101 rising caused by the protrusion is avoided, which reduces the accommodation volume of the cell string 101, and thus reducing the volume of the photovoltaic module. In addition, the problem that the welding strip 103 is easy to scratch the solar cell sheet 102 and the bus bar 1024 caused by the recess portion is avoided, and the integrity of the grid line of the solar cell sheet 102 and the overall photoelectric conversion efficiency of the solar cell sheet 102 are guaranteed.

Figure 11:
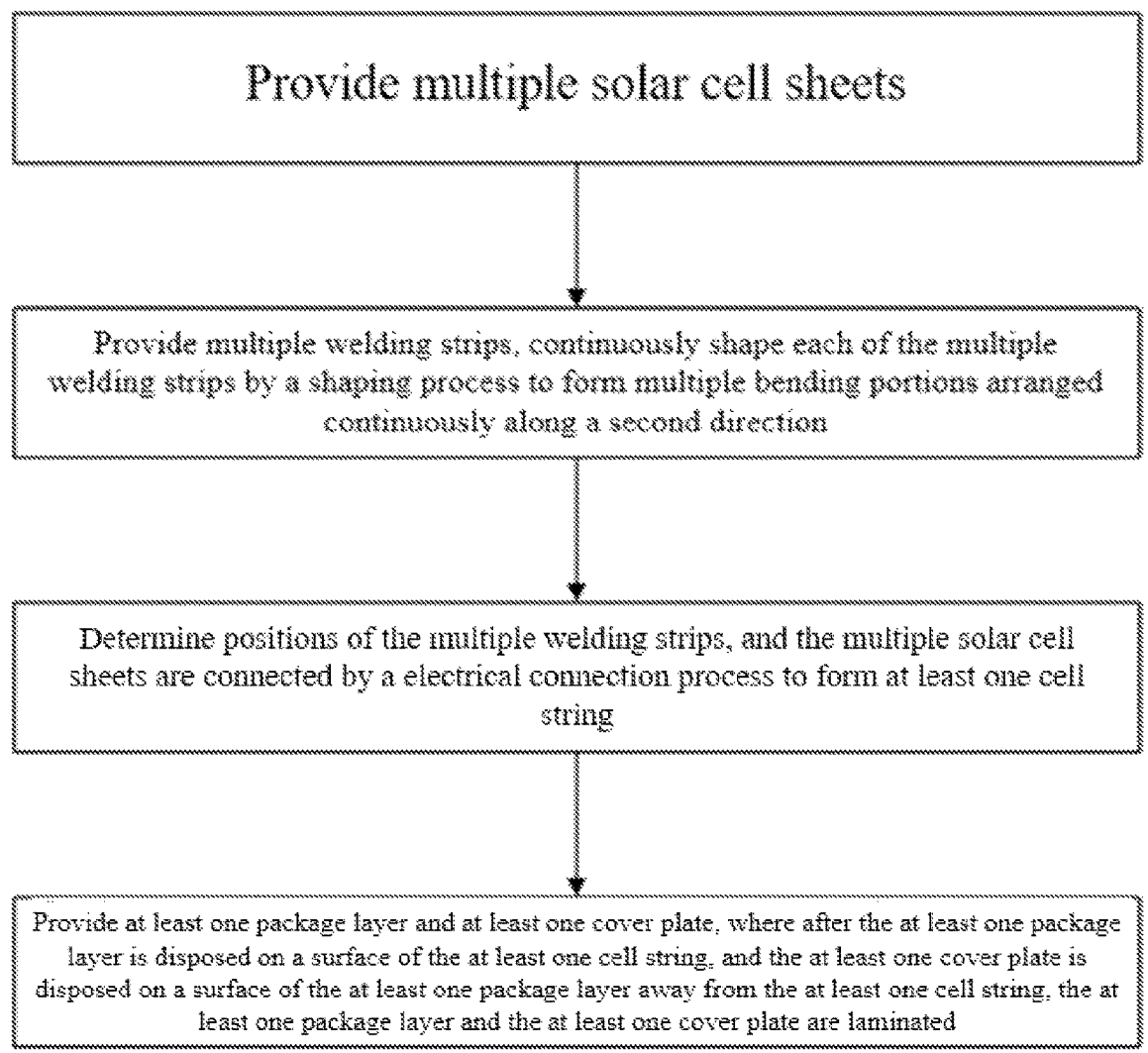
FIG. 11 is a flow chart of a method for preparing a photovoltaic module provided according to another embodiment of the present disclosure.

Correspondingly, a method for preparing the photovoltaic module is further provided according to another embodiment of the disclosure, to prepare the photovoltaic module provided according above embodiments of the present disclosure. The specific process of the method can refer to FIG. 11, and includes the following operations.

Referring to FIG. 2 and FIG. 4, at least one cell string 101 is provided.

Each of the at least one cell string 101 includes solar cell sheets 102, and each of the multiple solar cell sheets 102 includes a substrate 1021, the substrate 1021 has a front surface and a back surface opposite to the front surface. The solar cell sheet 102 further includes a first passivation layer 1022 disposed on the front surface of the substrate 1021, a second passivation layer 1023 disposed on the back surface of the substrate 1021, multiple bus bars 1024 disposed on a surface of the second passivation layer 1023. The multiple bus bars 1024 are disposed at intervals along the first direction and extend along the second direction, and each of the multiple bus bars 1024 includes multiple bonding pads 1025 disposed at intervals along the second direction.

Referring to FIG. 2, multiple bus bars 1024 are provided. The multiple bus bars 1024 are disposed on a surface of the second passivation layer 1023, and the multiple bus bars 1024 are disposed at intervals along the first direction and extend along the second direction, and each of the multiple bus bars 1024 includes multiple bonding pads 1025 disposed at intervals along the second direction and the bus bar connecting line 801.

Referring to FIG. 3, multiple welding strips 103 are provided, and the multiple welding strips 103 are continuously shaped by the shaping process to form the bending portions arranged continuously along the extension direction. In the process of shaping the welding strip 103 to form the bending portion, since the continuous shaping method is adopted, it is unnecessary to consider how to space the bending portions and the distance between adjacent bending portions. Therefore, the shaping process is simpler and the yield of the shaped welding strip 103 is higher. In addition, since the welding strip 103 is composed of bending portions arranged continuously, the appearance of the welding strip 103 is smoother and aesthetic.

In some embodiments, the shaping process includes pressing, bending, forging, or stamping.

Referring to FIG. 1 to FIG. 3, the placement position of the welding strip 103 is determined, and the electrical connection process is performed to form the cell string 101.

Along the second direction, the orthographic projection of the central line of each welding strip 103 on the back surface of the solar cell sheet 102 is aligned with the orthographic projection of the central line of the corresponding bus bar 1024 on the back surface of the solar cell sheet 102 and/or the orthographic projection of the central line of each of the multiple bonding pads 1025 on the corresponding bus bar 1024 on the back surface of the solar cell sheet 102. After that, the electrical connection process is adopted to electrically contact each welding strip 103 with the corresponding bus bar 1024 to form the cell string 101, in which two adjacent solar cell sheets 102 are connected to each other by the welding strip 103.

Referring to FIG. 12, at least one package layer 120 and at least one cover plate 130 are provided. After the at least one package layer 120 is placed on a surface of the at least one cell string 101 and the at least one cover plate 130 is placed on a surface of the at least one package layer 120 away from the at least one cell string 101, the at least one package layer 120 and the at least one cover plate are laminated.

The photovoltaic module formed ultimately includes: the at least one cell string 101 formed by multiple solar cell sheets 102, and each of the at least one cell string 101 is the cell string 101 provided according to above embodiments. Each of the at least one package layer 120 is configured to cover the surface of the solar cell sheet 102. Each of the at least one cover plate 130 is configured to cover the surface of the at least one package layer 120 away from the solar cell sheet 102, and the multiple solar cell sheets 102 are electrically connected in series and/or parallel.

Specifically, in some embodiments, the multiple solar cell sheets 102 are electrically connected by the welding strips 103. The package layer 120 is configured to cover the front surface and the back surface of the solar cell sheet 102. Specifically, the package layer 120 may be an organic packaging adhesive film, such as an ethylene vinyl acetate copolymer (EVA) adhesive film, a polyethylene octene copolymer (POE) adhesive film, or a polyethylene terephthalate (PET) adhesive film. In some embodiments, the cover plate 130 may be a glass cover plate, a plastic cover plate or the like with a light transmission function. Specifically, the surface of the cover plate 130 toward the package layer 120 can be a surface with protrusions and recesses, thereby increasing the utilization rate of incident light.

Although the present disclosure is disclosed above with preferred embodiments, it is not used to limit the claims. Any person skilled in the art can make some possible changes and modifications without departing from the concept of the present disclosure. The scope of protection shall be subject to the scope defined by the claims of the present disclosure.

Those of ordinary skill in the art can understand that the above embodiments are specific examples for realizing the present disclosure, and in actual disclosures, various changes may be made in shape and details without departing from the spirit and range of the present disclosure. Any person skilled in the art can make their own changes and modifications without departing from the spirit and scope of the present disclosure. Therefore, the protection scope of the present disclosure should be subject to the scope defined by the claims.

What is claimed is:

1. A photovoltaic module, comprising:
   at least one cell string, wherein each of the at least one cell string includes a plurality of solar cell sheets, each of the plurality of solar cell sheets includes a substrate having a front surface and a back surface opposite to the front surface, and a plurality of bus bars disposed on the back surface, the plurality of bus bars are disposed at intervals along a first direction and extend along a second direction, and each of the plurality of bus bars includes a plurality of bonding pads disposed at intervals along the second direction and a bus bar connecting line; and
   a plurality of welding strips, wherein each welding strip of the plurality of welding strips is configured to connect two adjacent solar cell sheets in the plurality of solar cell sheets, to be in electrical contact with a corresponding bus bar on each of the two adjacent solar cell sheets, and to have a plurality of bending portions arranged continuously along the second direction, and wherein an orthographic projection of a central line of the each welding strip on a back surface of a solar cell sheet coincides with an orthographic projection of a central line of the corresponding bus bar on each of the two adjacent solar cell sheets and/or an orthographic projection of a central line of each of the plurality of bonding pads of the corresponding bus bar on the back surface of each of the two adjacent solar cell sheets;
   wherein along the second direction, adjacent bending portions in the plurality of bending portions are bent in a same direction or opposite directions.

2. The photovoltaic module according to claim 1, wherein the plurality of bending portions are bent in a shape of arc, zigzag or broken line.

3. The photovoltaic module according to claim 1, wherein each of the plurality of bonding pads is in electrical contact with two adjacent bending portions in the plurality of bending portions on each of the plurality of welding strips.

4. The photovoltaic module according to claim 3, wherein each of the plurality of bending portions comprises a first bending portion in electrical contact with a corresponding bonding pad in the plurality of bonding pads and a second bending portion not in electrical contact with any of the plurality of bonding pads; along a third direction, the first bending portion is bigger than the second bending portion in size, and the third direction is perpendicular to a bending direction of each of the plurality of bending portions.

5. The photovoltaic module according to claim 1, wherein in a fourth direction, a distance between a bending vertex of each of the plurality of bending portions away from a corresponding bus bar and the corresponding bus bar ranges from 0.1 mm to 0.3 mm, and the fourth direction is perpendicular to the second direction.

6. The photovoltaic module according to claim 5, wherein the distance between the bending vertex of each of the plurality of bending portions away from the corresponding bus bar and the corresponding bus bar is 0.15 mm, 0.2 mm or 0.25 mm.

7. The photovoltaic module according to claim 1, wherein a ratio of a length of each of the plurality of bending portions in a bending direction to a length of each of the plurality of bending portions along the second direction ranges from 1.05 to 1.25.

8. The photovoltaic module according to claim 7, wherein the ratio of the length of each of the plurality of bending portions in the bending direction to the length of each of the plurality of bending portions along the second direction is 1.10, 1.15 or 1.20.

9. The photovoltaic module according to claim 1, wherein the plurality of bending portions are the same in length along the second direction.

10. The photovoltaic module according to claim 1, wherein each of the plurality of welding strips is in a plane parallel to the back surface of the solar cell sheet.

11. The photovoltaic module according to claim 10, wherein the substrate is a silicon substrate, and the silicon substrate is made of at least one of monocrystalline silicon, polycrystalline silicon, amorphous silicon, or microcrystalline silicon.

12. The photovoltaic module according to claim 11, wherein the first direction is perpendicular to the second direction, or there is an included angle of less than 90 degrees between the first direction and the second direction.

13. The photovoltaic module according to claim 12, wherein the included angle is 60 degrees, 45 degrees, or 30 degrees.

14. The photovoltaic module according to claim 13, wherein the bus bar connecting line is divided into a plurality of solder resist areas arranged along the second direction by each of the plurality of bonding pads on the bus bar, and the plurality of solder resist areas are processed by printing or dispensing with solder resist ink.

15. The photovoltaic module according to claim 14, wherein the solder resist ink is used to completely cover each of the plurality of solder resist areas, or each of the plurality of solder resist areas is divided into a plurality of solder resist sub areas, each of the plurality of solder resist sub areas is completely covered, and position of each of the plurality of solder resist sub areas corresponds to position of a heteropolarity finger with opposite polarity to the bus bar.

16. The photovoltaic module according to claim 15, wherein the solder resist ink has a thickness being 15 µm or above higher than a height of each of the plurality of solder resist areas or each of the plurality of solder resist sub areas, and the solder resist ink has a width being 50 µm or above wider than a width of each of the plurality of solder resist areas or each of the plurality of solder resist sub areas.

17. The photovoltaic module according to claim 14, wherein the solder resist ink is insulating glue.

18. The photovoltaic module according to claim 1, further comprising at least one package layer and at least one cover plate, wherein the at least one package layer is disposed on a surface of the at least one cell string, the at least one cover plate is disposed on a surface of the at least one package layer away from the at least one cell string, and the at least one package layer and the at least one cover plate are laminated.

19. A method for preparing a photovoltaic module, comprising:
- providing at least one cell string, wherein each of the at least one cell string includes a plurality of solar cell sheets, and each of the plurality of solar cell sheets includes a substrate having a front surface and a back surface opposite to the front surface;
- providing a plurality of bus bars, wherein the plurality of bus bars are disposed on a surface of the second passivation layer, and the plurality of bus bars are disposed at intervals along a first direction and extend along a second direction, and each of the plurality of bus bars includes a plurality of bonding pads disposed at intervals along the second direction and a bus bar connecting line;
- providing a plurality of welding strips, continuously shaping each of the multiple welding strips by a shaping process to shape a plurality of bending portions arranged continuously along the second direction, wherein two adjacent solar cell sheets in the plurality of solar cell sheets are connected to each other by one of the plurality of welding strips, and each of the plurality of welding strips is in electrical contact with a corresponding bus bar; along the second direction, an orthographic projection of a central line of each of the plurality of welding strips on a back surface of a solar cell sheet coincides with an orthographic projection of a central line of the corresponding bus bar on the back surface of the solar cell sheet and/or an orthographic projection of a central line of each of the plurality of bonding pads on the corresponding bus bar on the back surface of the solar cell sheet; and
- providing at least one package layer and at least one cover plate, wherein after the at least one package layer is disposed on a surface of at least one cell string, and the at least one cover plate is disposed on a surface of the at least one package layer away from the at least one cell string, the at least one package layer and the at least one cover plate are laminated.

20. The method for preparing a photovoltaic module according to claim 19, wherein the shaping process comprises pressing, bending, forging, or stamping.

* * * * *